(12) United States Patent
Huang et al.

(10) Patent No.: US 7,663,851 B2
(45) Date of Patent: Feb. 16, 2010

(54) TIE-OFF CIRCUIT WITH ESD PROTECTION FEATURES

(75) Inventors: Shao-Chang Huang, Hsinchu (TW); Jian-Hsing Lee, Hsin-chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 190 days.

(21) Appl. No.: 11/137,265

(22) Filed: May 25, 2005

(65) Prior Publication Data
US 2006/0268474 A1 Nov. 30, 2006

(51) Int. Cl.
H02H 9/00 (2006.01)
H02H 3/20 (2006.01)
H02H 9/04 (2006.01)
H02H 3/22 (2006.01)

(52) U.S. Cl. ............ 361/56; 361/91.1; 361/111; 361/118

(58) Field of Classification Search ............ 361/56, 361/91.1, 111, 118
See application file for complete search history.

(56) References Cited

U.S. PATENT DOCUMENTS

| 4,264,941 A * | 4/1981 | London .......... 361/91.5 |
| 4,384,287 A * | 5/1983 | Sakuma .......... 345/60 |
| 4,466,120 A | 8/1984 | Walker, Jr. et al. ...... 381/109 |
| 5,287,241 A | 2/1994 | Puar .............. 361/56 |
| 5,691,557 A * | 11/1997 | Watanabe .......... 257/357 |
| 6,507,469 B2 * | 1/2003 | Andoh ............ 361/56 |
| 6,583,972 B2 * | 6/2003 | Verhaege et al. ...... 361/56 |
| 6,590,264 B2 * | 7/2003 | Ker et al. .......... 257/355 |
| 6,643,109 B1 * | 11/2003 | Li et al. .......... 361/56 |
| 6,671,146 B1 * | 12/2003 | Hashimoto et al. ...... 361/56 |
| 7,064,942 B2 * | 6/2006 | Ker et al. .......... 361/56 |
| 2003/0107424 A1 | 6/2003 | Huang ............ 327/310 |
| 2003/0214768 A1 * | 11/2003 | Lin et al. .......... 361/56 |
| 2005/0093069 A1 * | 5/2005 | Logie ............ 257/355 |

FOREIGN PATENT DOCUMENTS

| TW | 1222202 | 10/2004 |
| WO | WO 2004/091256 A1 | 10/2004 |

* cited by examiner

*Primary Examiner*—Albert W Paladini
*Assistant Examiner*—Dharti H Patel
(74) *Attorney, Agent, or Firm*—K&L Gates LLP

(57) ABSTRACT

The present invention discloses a tie-off circuit coupled between a first potential and a gate of a MOS device whose source is connected to a second potential. The tie-off circuit includes at least one resistor and at least on diode. The resistor is coupled between the gate of the MOS device and the first potential for preventing the gate of the MOS device from floating during a normal circuit operation. The diode is coupled between the gate of the MOS device and the first potential, in parallel with the resistor, for reducing a voltage difference across a gate oxide layer of the MOS device during an electrostatic discharge (ESD) event, thereby protecting the same from ESD damage.

17 Claims, 7 Drawing Sheets

TIE-OFF CIRCUIT WITH ESD PROTECTION FEATURES

BACKGROUND

The present invention relates generally to an integrated circuit (IC) design, and more particularly to a tie-off circuit capable of protecting a circuit element during an electrostatic discharge (ESD) event.

A gate oxide of a metal-oxide-semiconductor (MOS) transistor of an IC is most susceptible to damage. The gate oxide may be destroyed by being contacted with a voltage only a few volts higher than a supply voltage. It is understood that a regular supply voltage in an IC is 5.0, 3.3 volts or even lower. Electrostatic voltages from common environmental sources can easily reach thousands, or even tens of thousands of volts. Such voltages are destructive even though the charge and any resulting current are extremely small. For this reason, it is of critical importance to discharge any static electric charge before it damages the IC.

An ESD can occur, for example, when a person touches some of the pads on the IC. This is the same static electricity that may be painfully experienced by a person who walks across a carpet on a dry day and then touches a grounded metal object. In an isolated IC, the ESD acts as a brief power supply for one or more pads, while the other pads remain floating, or grounded. Because the other pads are grounded, when the ESD acts as a power supply at a randomly selected pad, the protection circuitry acts differently than it does when the IC is operating normally. When an ESD event occurs, the protection circuitry must quickly become conductive so that the electrostatic charge is conducted to VSS or ground and is dissipated before damaging a core circuit of the IC.

While an ESD protection circuit is typically implemented to protect a core circuit from being damaged, it is still possible for the MOS transistors of an inverter within the protected core circuit to be damaged during an ESD event. The tie-off inverter, which typically includes a PMOS transistor and an NMOS transistor, is commonly implemented within the core circuit to provide a high or low signal. The gate oxide layers of the MOS transistors within the inverter can be easily damaged by a raised voltage created during an ESD event. This raised voltage may apply a severe electric stress on a gate oxide layer of the MOS transistor. For example, under the ESD conditions, there may be a large difference between the source voltage and the gate voltage of the MOS transistor, thereby creating a high source-to-gate voltage. This high source-to-gate voltage will apply severe electric stress on the gate-oxide of the MOS transistor. The gate-oxide of the MOS transistor may be damaged once it is charged to a certain voltage level. In order to reduce this stress, the voltage difference between the source and gate needs to be reduced.

Desirable in the art of inverter designs are tie-low or tie-high circuits that reduce the source-to-gate voltage of the MOS transistors within the inverter, thereby protecting the gate oxide layers of the MOS transistors from damage during an ESD event.

SUMMARY

The present invention discloses a tie-off circuit coupled between a first potential and a gate of a MOS device whose source is connected to a second potential. The tie-off circuit includes at least one resistor and at least one diode. The resistor is coupled between the gate of the MOS device and the first potential for preventing the gate of the MOS device from floating during a normal circuit operation. The diode is coupled between the gate of the MOS device and the first potential, in parallel with the resistor, for reducing a voltage difference across a gate oxide layer of the MOS device during an electrostatic discharge (ESD) event, thereby protecting the same from ESD damage.

The construction and method of operation of the invention, however, together with additional objects and advantages thereof will be best understood from the following description of specific embodiments when read in connection with the accompanying drawings.

DESCRIPTION

The present disclosure provides an improved tie-off circuit, such as a tie-low or tie-high circuit, for connecting an input node of an inverter to a low or high potential. The inverter includes a PMOS transistor serially connected to an NMOS transistor. The tie-off circuit may include a diode and resistor that are capable of adjusting the gate voltage of the MOS transistors within the inverter during an ESD event, such that the electric stress applied on their gate oxide layers can be reduced.

Figure 1:
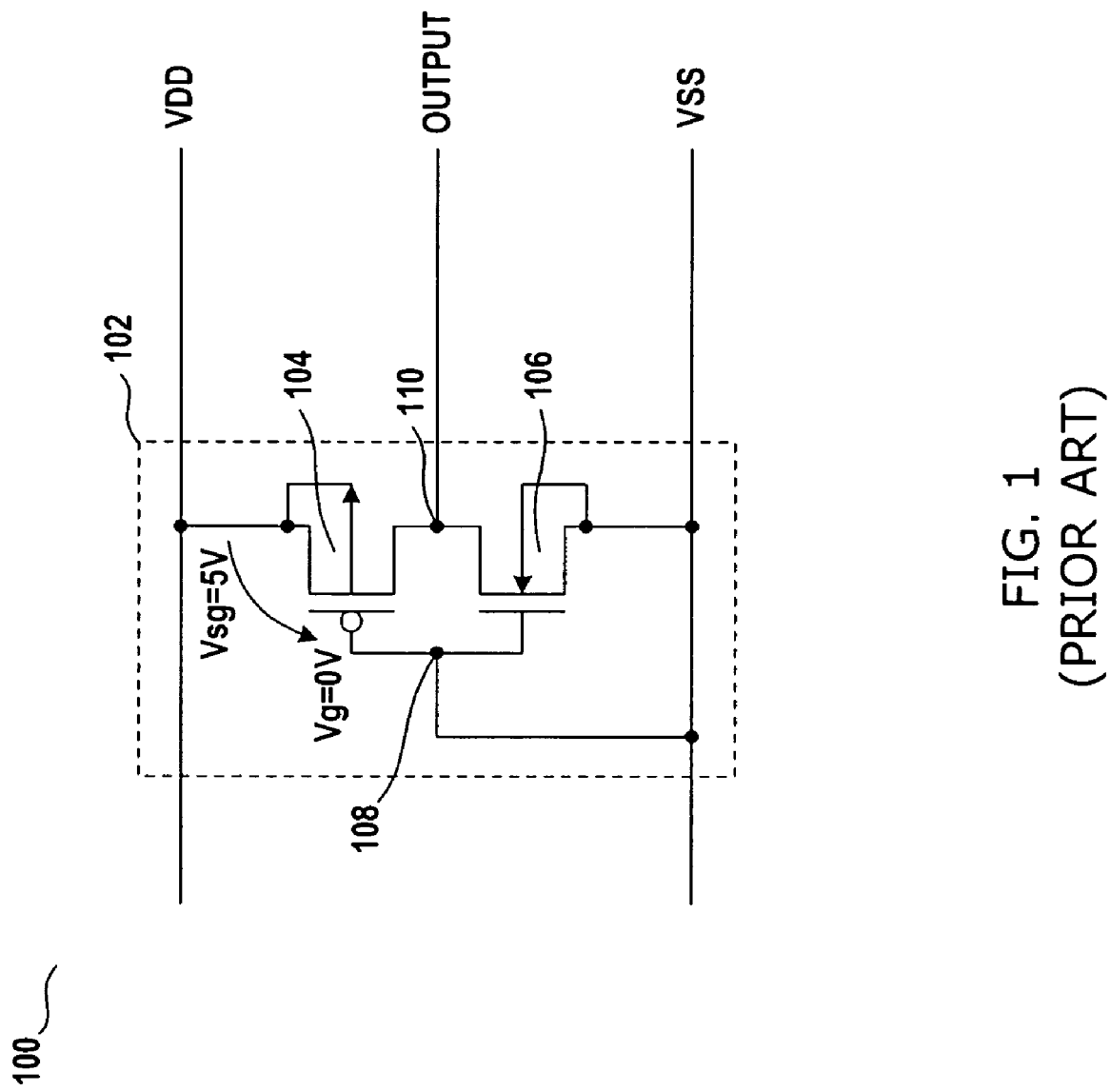
FIG. 1 illustrates a circuit diagram showing a conventional tie-low circuit for connecting an input node of an inverter to ground.

FIG. 1 illustrates a circuit diagram 100 showing a conventional inverter 102 whose input node is directly tied to ground, or VSS. The inverter 102 includes a PMOS transistor 104 and an NMOS transistor 106. The gate of the PMOS transistor 104 and the gate of NMOS transistor 106 are coupled together at a node 108. The drains of the PMOS transistor 104 and the NMOS transistor 106 are coupled together at a node 110, which in this example, also connects to an output line of the inverter 102. The node 108 is directly tied to VSS. This will turn on the PMOS transistor 104 and turn off the NMOS transistor 106, thereby allowing the inverter 102 to output a high signal at the node 110 during normal circuit operation. However, this tie-low circuit may not provide proper protection for the gate-oxide of the PMOS transistor 104 during an ESD event. With the node 108 coupled to VSS and a source of the PMOS transistor 104 connected to operating voltage (VDD), the PMOS transistor 104 will have a gate voltage (Vg) of 0 volts and a source voltage (Vs) equivalent to VDD, which in this example, is 5 volts during normal operation. While the gate-oxide of the PMOS transistor 104 may be designed to withstand a source-to-gate voltage (Vsg) of 5 volts, it may not be able to handle a raised potential voltage from VDD during an ESD event. When the ESD occurs, the source-to-gate voltage may reach a level higher than VDD, charging up an oxide capacitor within the PMOS transistor 104. This high source-to-gate voltage and the charged-up capacitance can create a high electric stress on the gate-oxide of the PMOS transistor 104, thereby damaging the transistor.

Figure 2A:
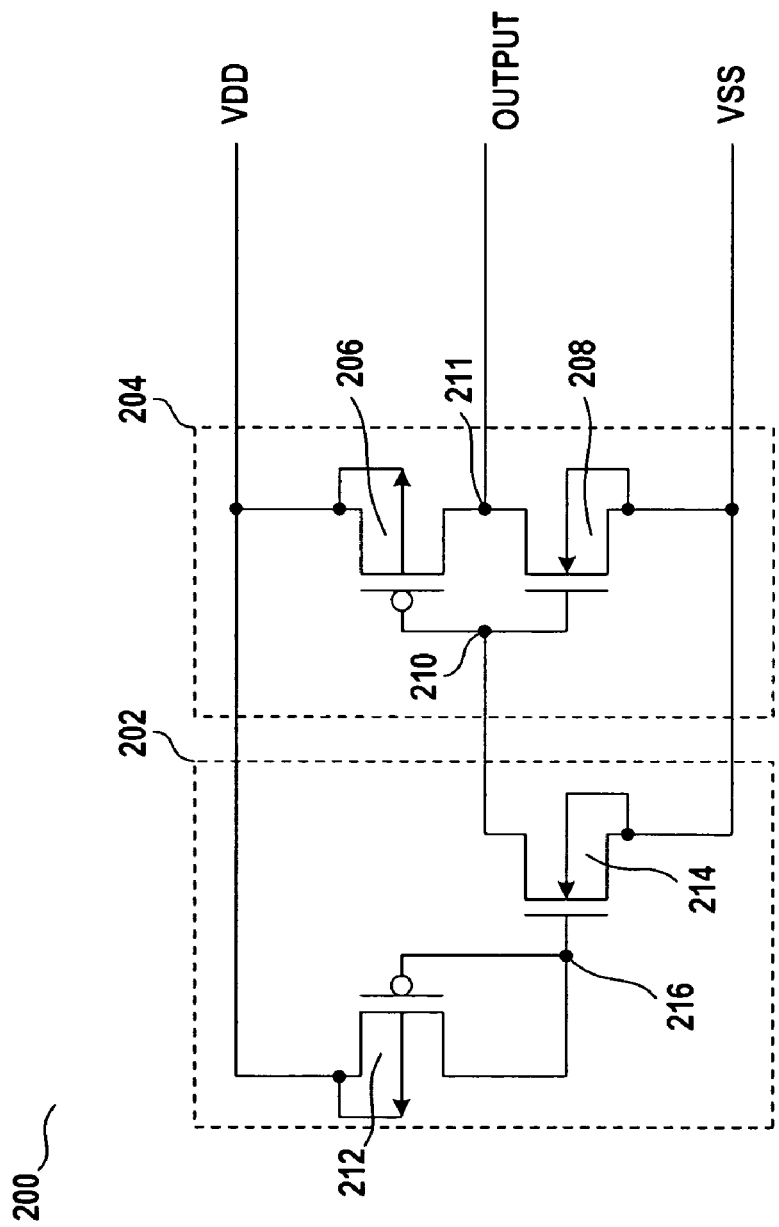
FIG. 2A illustrates a circuit diagram showing another conventional tie-low circuit for connecting an input node of an inverter to ground.

FIG. 2A illustrates a circuit diagram 200 showing a conventional tie-low circuit 202 coupled to an input node 210 of an inverter 204. The inverter 204 includes a PMOS transistor 206 and an NMOS transistor 208. The two transistors 206 and 208 are stacked in a cascade formation with both gates coupled together at the node 210. The drains of the PMOS transistor 206 and the NMOS transistor 208 are coupled together at a node 211, which in this example, also connects to an output line of the inverter 204. The tie-low circuit 202, used for tying the node 210 low to VSS, includes a PMOS transistor 212, and an NMOS transistor 214. The gate and the drain of the PMOS transistor 212 are coupled with the gate of the NMOS transistor 214 at a node 216. In normal circuit operation, the PMOS transistor 212 will be turned on, and will act as a resistor for allowing VDD to reach the node 216 and the gate of the NMOS transistor 214. The NMOS transistor 214 will be turned on, thereby pulling the node 210 low to VSS. This configuration will allow the PMOS transistor 206 to be turned on and the NMOS transistor 208 to be turned off during the normal circuit operation, thereby allowing the inverter 204 to output a high signal at the node 211.

During an ESD event, the voltage at the line connected to VDD may reach a higher potential. The PMOS transistor 212, which is coupled to the interconnect line used for the source VDD, will only act as a resistor since a well of the PMOS transistor 212 is coupled to its source. The NMOS transistor 214 is designed to be turned on when a voltage is applied at the node 216. With the NMOS transistor 214 on, the node 210 is pulled low to VSS through the NMOS transistor 214.

It is possible for the PMOS transistor 206 to be damaged by using this conventional circuit during an ESD event since there is still a large voltage difference between its source voltage (Vs) and gate voltage (Vg). The source-to-gate voltage (Vsg) of the PMOS transistor 206, which is the source voltage (Vs) minus the gate voltage (Vg), will be much higher during an ESD event since the voltage on the line connected to VDD will raise up. This large source-to-gate voltage (Vsg) will charge-up an oxide capacitor at the gate-oxide within the transistor, thereby creating a severe electric stress on the gate-oxide of the PMOS transistor 206. This severe stress may be enough to damage the gate-oxide of the PMOS transistor 206.

Figure 2B:
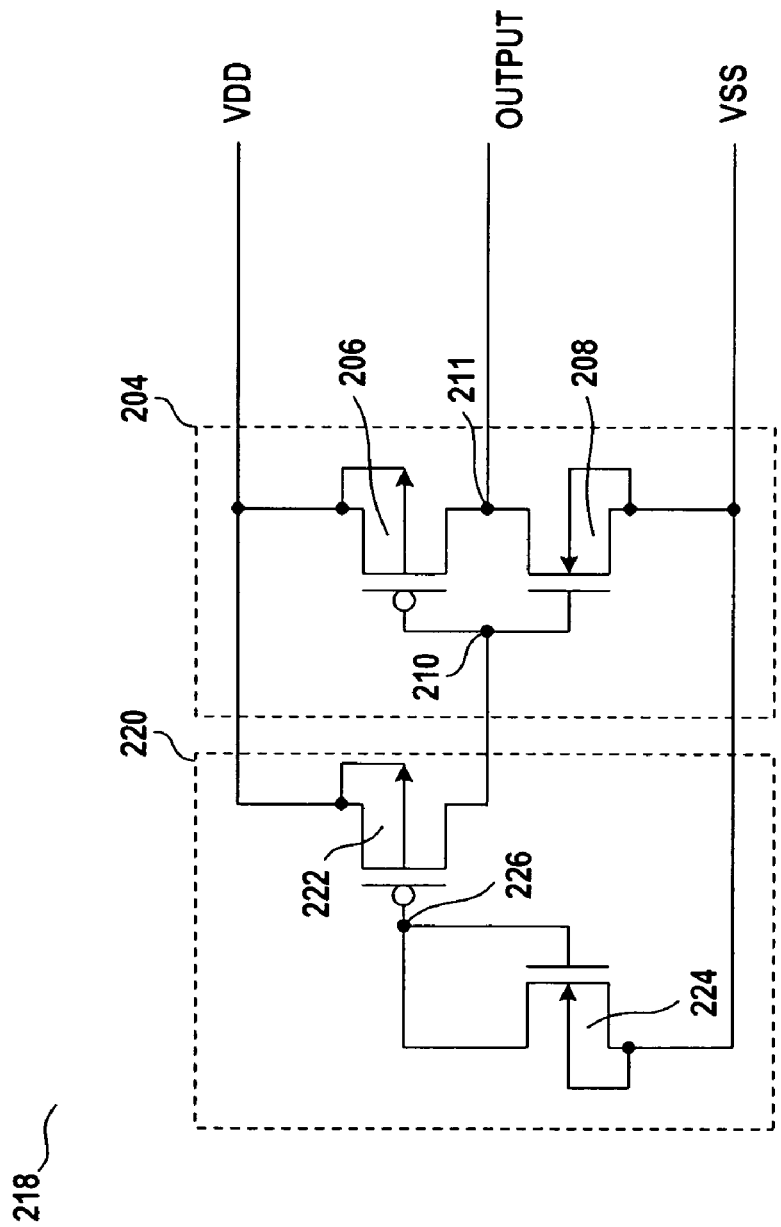
FIG. 2B illustrates a circuit diagram showing a conventional tie-high circuit for connecting an input node of an inverter to an operating voltage.

FIG. 2B illustrates a circuit diagram 218 showing a conventional tie-high circuit coupled to an input node 210 of an inverter 204. The inverter 204 includes the PMOS transistor 206 and the NMOS transistor 208. The two transistors 206 and 208 are stacked in a cascade formation with both gates coupled together at the node 210. The drains of the PMOS transistor 206 and the NMOS transistor 208 are coupled together at the node 211, which in this example, also connects to an output line of the inverter 204. The tie-high circuit 220, used for tying the node 210 high to VDD, includes a PMOS transistor 222, and an NMOS transistor 224. The gate and the drain of the NMOS transistor 224 are coupled with the gate of the PMOS transistor 222 at a node 226. In normal circuit operation, the NMOS transistor 224 will be turned on, and will act as a resistor for allowing the node 226 to be pulled low. This will turn on the PMOS transistor 222, thereby opening a current path between the node 210 and VDD. This configuration will allow the PMOS transistor 206 to be turned off and the NMOS transistor 208 to be turned on during the normal circuit operation, thereby allowing the inverter 204 to output a low signal at the node 211.

During an ESD event, the voltage at the line connected to VDD may reach a higher potential. The NMOS transistor 224, which is coupled to the interconnect line used for VSS, will only act as a resistor since a substrate of the NMOS transistor 224 is coupled to its source. The PMOS transistor 222 is designed to be turned on when the node 226 is pulled low. With the PMOS transistor 222 on, the node 210 is pulled high through the PMOS transistor 222.

It is still possible for the NMOS transistor 208 to be damaged with this conventional circuit during an ESD event since there is still a high voltage difference between its source voltage (Vs) and the gate voltage (Vg). For example, the source voltage (Vs) of the NMOS transistor 208 is equivalent to VSS while the gate voltage (Vg) of the NMOS transistor 208 is equivalent to the ESD voltage on the VDD line. When the ESD occurs, there will be a large source-to-gate voltage (Vsg) generated from the difference between the source voltage (Vs) and the gate voltage (Vg) of the NMOS transistor 208. This high source-to-gate voltage (Vsg) will charge up the oxide capacitor at the gate-oxide within the NMOS transistor 208 and create a severe electric stress on, and potentially damaging, its gate-oxide.

Figure 3A:
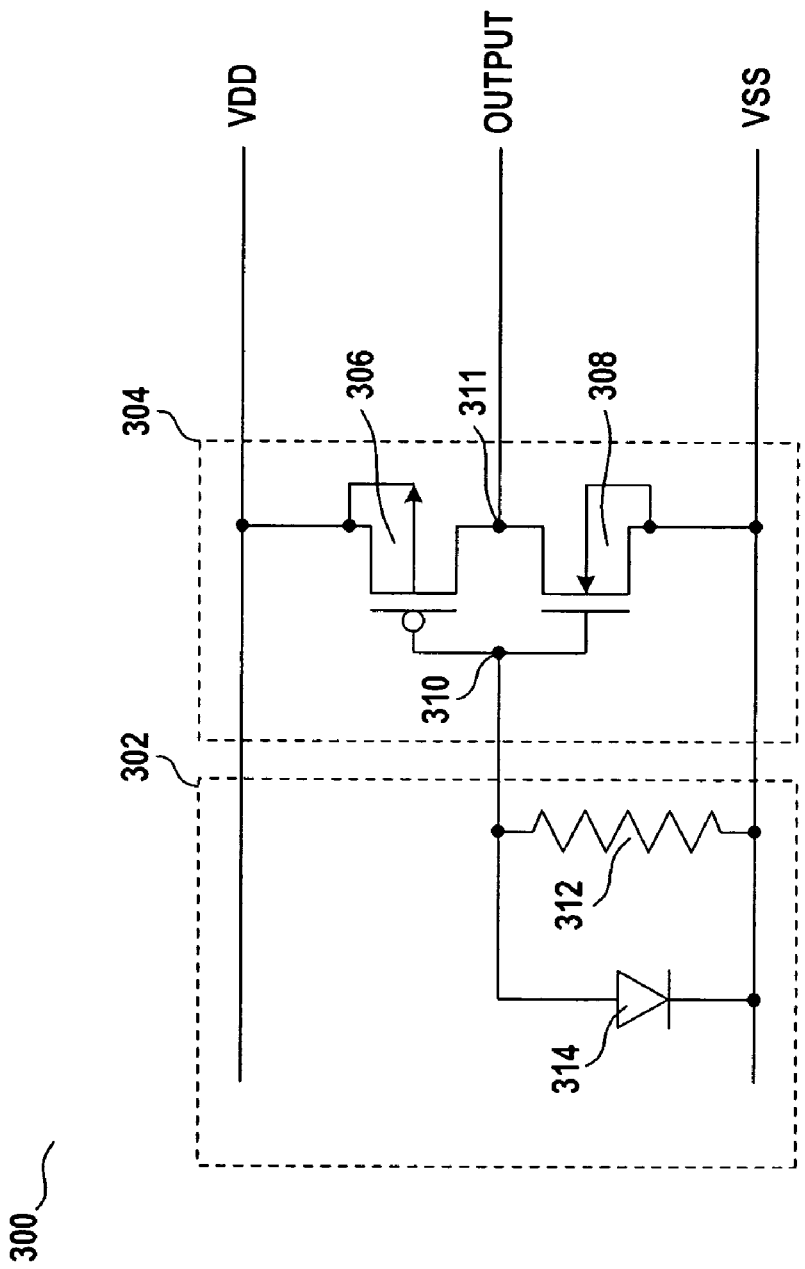
FIGS. 3A-3D provide four circuit diagrams, each showing a tie-low or tie-high circuit capable of protecting the MOS transistors within an inverter during an ESD event, in accordance with various embodiments of the present invention.

FIG. 3A provides a circuit diagram 300 showing a tie-low circuit capable of protecting MOS transistors within an inverter during an ESD event in accordance with one embodiment of the present invention. The circuit diagram 300 includes a tie-low circuit 302 and an inverter 304. The inverter 304 includes a PMOS transistor 306 and an NMOS transistor 308. The two transistors 306 and 308 are stacked in a cascade formation with both gates coupled together at a node 310. The drains of the PMOS transistor 306 and NMOS transistor 308 are coupled together at a node 311, which in this example, connects to an output line of the inverter 304. The tie-low circuit 302, used for tying the node 310 low to VSS, includes a resistor 312 and a diode 314 in parallel therewith. The cathode of the diode 314 is connected to VSS. The resistor 312 is implemented to ensure the node 310 stay grounded during the normal circuit operation to prevent the gates of the transistors 306 or 308 from floating. The diode 314 is implemented to raise a gate voltage (Vg) of the transistors 306 and 308. The higher gate voltage (Vg) lessens a source-to-gate voltage (Vsg) and the electric stress on the gate-oxide of the transistors 306 and 308 during an ESD event, thus reducing the probability of ESD damage. Since the node 310 is tied-low through the resistor 312, the PMOS transistor 306 will be turned on and the NMOS transistor 308 will be turned off during the normal circuit operation, thereby allowing the inverter 304 to output a high signal at the node 311.

During an ESD event, the voltage at the line connected to VDD will reach a higher potential. The diode 314, which is coupled to the interconnect line used for VSS, will provide the PMOS transistor 306 and the NMOS transistor 308 with the gate voltage (Vg) that is substantially equal to a voltage drop (Vd) across the diode 314. This helps lower the source-to-gate voltage (Vsg) of the PMOS transistor 306, thereby lowering the electric stress on the gate-oxide thereof. With less stress on the gate-oxide of the PMOS transistor 306, the chance of the PMOS transistor 306 being damaged during ESD events is reduced.

Figure 3B:
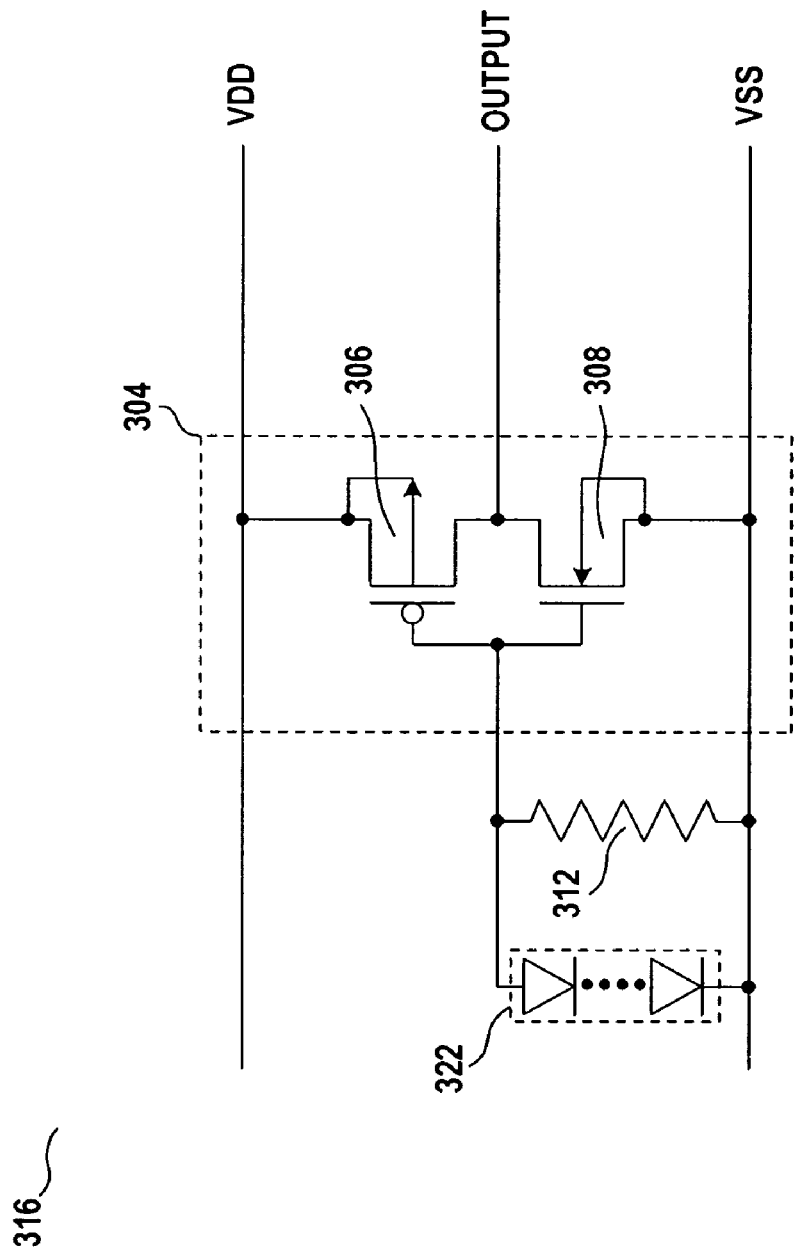

FIG. 3B illustrates a circuit diagram 316 showing a tie-low circuit capable of protecting MOS transistors within an inverter during an ESD event in accordance with another embodiment of the present invention. The circuit diagram 316 is similar to the circuit diagram 300 in FIG. 3A, except that the diode 314 is replaced by a diode string 322, which includes more than one serially connected diodes. A tie-low circuit includes the diode string 322 and a resistor 312. The cathode of the diode string 322 is connected to VSS, while the anode of the same is connected to the gates of the MOS transistors 306 and 308. During an ESD event, the circuit diagram 316 operates in the same manner as the circuit diagram 300, except that a higher gate voltage (Vg) for the MOS transistors 306 and 308 is created by the extra diodes from the diode string 322. The higher gate voltage can further lessen the source-to-gate voltages of the PMOS transistor 306, thereby protecting its gate oxide from damage caused by excessive electric stress.

Figure 3C:
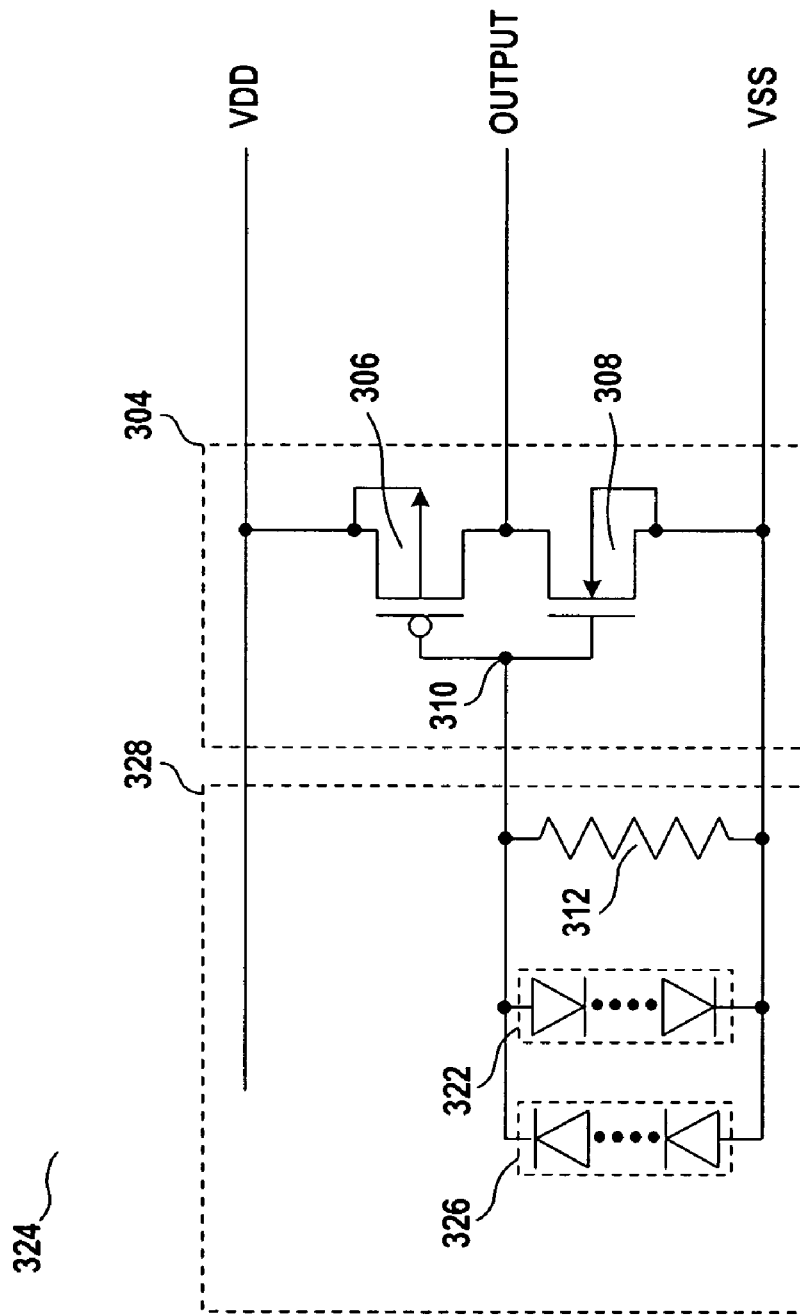

FIG. 3C illustrates a circuit diagram 324 showing a tie-low circuit capable of protecting MOS transistors within an inverter during an ESD event in accordance with another embodiment of the present invention. The circuit diagram 324 is similar to the circuit diagram 316 of FIG. 3B, except that an additional diode string 326 is added. Unlike the diode string 322, the cathode of the diode string 326 is connected to the node 310, while its anode is connected to VSS. The combination of the resistor 312 and the diode strings 322 and 326 can be seen as a tie-low circuit 328. During an ESD event, the diode string 326 protects the gate oxide of the PMOS transistor 306 when the voltage at VSS is larger than its gate voltage (Vg), while the diode string 322 protects the same when the gate voltage (Vg) is larger than VSS. The configurations shown within FIGS. 3A and 3B may not provide the necessary protection for the PMOS transistor 306 when the voltage at the ground VSS is larger than the gate voltage. In order to protect the PMOS transistor 306 from this condition, the diode string 326 is implemented to help lower the gate voltage (Vg), thus lessening the voltage difference between the source voltage (Vs) and the gate voltage (Vg) of the PMOS transistor 306. The diode string 322 is implemented to raise the gate voltage (Vg) of the PMOS transistor 306 when the gate voltage (Vg) is larger than the voltage at VSS. This will lower the source-to-gate voltage (Vsg) of the PMOS transistor 306, thus lessening the charge on the oxide capacitor of its gate-oxide. With the diode strings 322 and 326 implemented in a tie-low configuration, both gate-oxides of the PMOS transistor 306 and the NMOS transistor 308 within the inverter 304 will not be damaged during an ESD event.

Figure 3D:
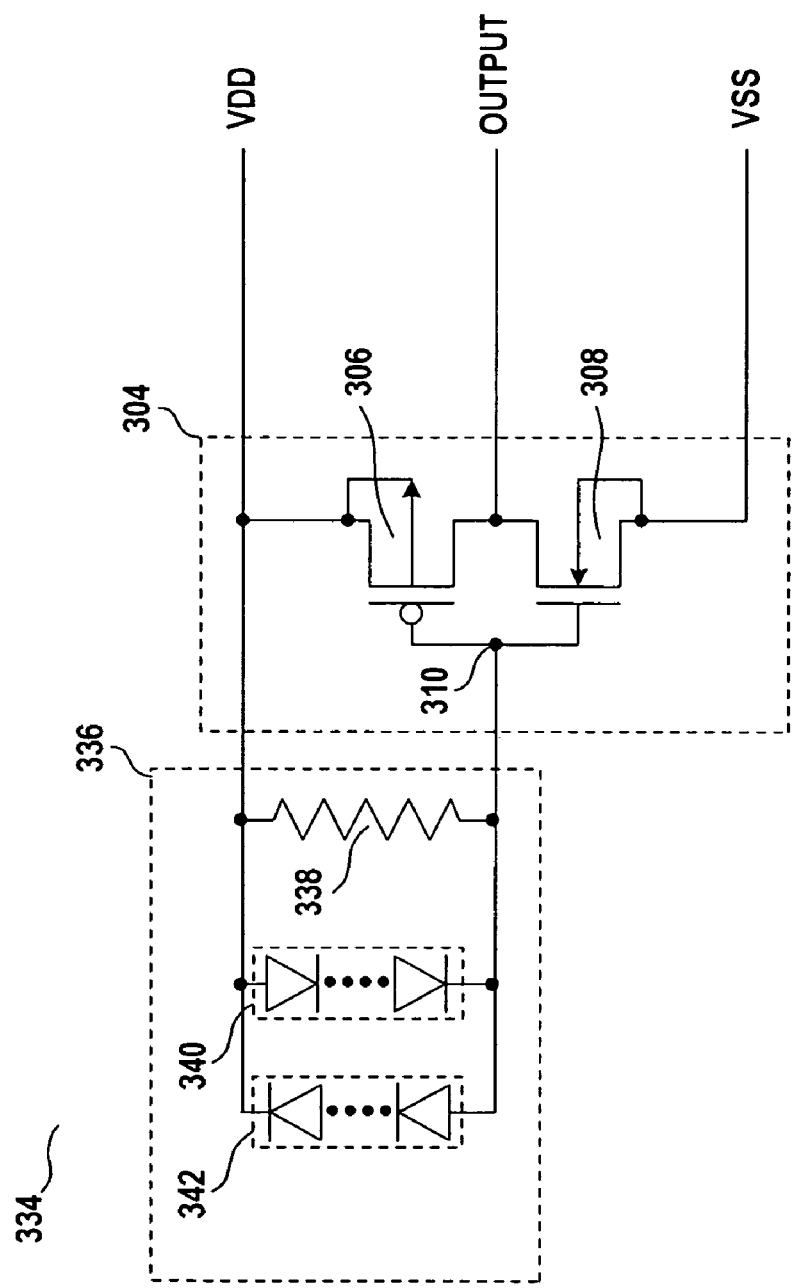

FIG. 3D illustrates a circuit diagram 334 showing a tie-high circuit capable of protecting MOS transistors within an inverter during an ESD event in accordance with another embodiment of the present invention. The circuit diagram 334 includes a tie-high circuit 336 and the inverter 304 in FIG. 3A. The tie-high circuit 336, used for tying the node 310 high to VDD, includes a resistor 338 and two diode strings 340 and 342. Since the node 310 is tied-high through the resistor 338, the PMOS transistor 306 will be turned off and the NMOS transistor 308 will be turned on in normal circuit operation, thereby allowing the inverter 304 to output a low signal.

The diode string 342, whose anode and cathode are connected to the node 310 and VDD, respectively, is implemented to protect the gate-oxide of the NMOS transistor 308 when the gate voltage (Vg) of the NMOS transistor 308 is larger than the voltage at the line connected to VDD during an ESD event. An ESD event creating such a condition can damage the gate-oxide of the NMOS transistor 308 since the source voltage (Vs) of the transistor will be much higher than the gate voltage (Vg) of the transistor. In order to protect the NMOS transistor 308 from this condition, the diode string 342 is implemented to help adjust the gate voltage (Vg), thus lessening the voltage difference between the source voltage (Vs) and the gate voltage (Vg) of the NMOS transistor 308. The diode string 340, whose anode and cathode are connected to the line connected to VDD and the node 310, respectively, is implemented to lower the gate voltage (Vg) of the NMOS transistor 308 when the voltage at the line connected to VDD is larger than the gate voltage (Vg). This will lower the source-to-gate voltage (Vsg) of the NMOS transistor 308, thus lessening the charge on the oxide capacitor of the gate-oxide within the NMOS transistor 308. With the diode strings 340 and 342 implemented in a tie-high configuration, both gate-oxides of the PMOS transistor 306 and the NMOS transistor 308 within the inverter 304 will be protected during an ESD event.

It is noted that the diode strings 340 and 342 can be implemented separately, or replaced by a single diode. The operation of such modified tie-high circuit would be similar to that of the tie-low circuits shown in FIGS. 3A-3B.

This invention provides various embodiments of tie-low and tie-high circuits. Breakdown voltage performance among the circuit diagrams 100, 218, and 300 is compared in the following table:

| Circuit | Leak @ 1.65 volts | Breakdown voltage |
| --- | --- | --- |
| circuit diagram 100 | 0.25 μA | 5.3 |
| circuit diagram 218 | 13.1 nA | 5.4 |
| circuit diagram 300 | 21.02 nA | 6.2 |

The tie-low and tie-high circuits include at least one diode and a resistor to be connected in parallel. At least one diode is implemented to adjust the transistor gate voltage. By adjusting the gate voltage, the stress applied on the gate-oxide of the transistors can be reduced, thereby protecting the transistors. The resistor is implemented in this circuit to keep any transistors from floating during the normal circuit operation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A tie-low circuit capable of protecting a core circuit element during an electrostatic discharge (ESD) event, the tie-low circuit comprising:

at least one resistor coupled between the core circuit element and a ground potential for preventing the core circuit element from floating during a normal circuit operation, wherein the core circuit element includes a PMOS transistor and an NMOS transistor serially connected between a power supply voltage and the ground potential to form an inverter; and a first diode string having a first set of diodes coupled in series, an anode of the first diode string being connected to an input terminal of the inverter and a cathode of the first diode string being connected to the ground potential for raising a gate voltage of the PMOS transistor, thus lowering a source-to-gate voltage (Vgs) of the PMOS transistor to protect a gate oxide of the PMOS transistor when the gate voltage of the PMOS transistor is larger than a voltage at the ground potential during the ESD event.

2. The tie-low circuit of claim 1 wherein the first set of diodes comprises two or more diodes connected in series.

3. The tie-low circuit of claim 1 further comprising a second diode string having a second set of diodes coupled in series, a cathode of the second diode string being connected to the input terminal of the inverter and an anode of the second diode string being connected to the ground potential for lowering the gate voltage of the PMOS transistor, thus lessening the Vgs of the PMOS transistor to protect the gate oxide of the PMOS transistor when the gate voltage of the PMOS transistor is lower than the voltage at the ground potential during the ESD event.

4. The tie-low circuit of claim 3 wherein the second set of diodes comprises two or more diodes connected in series.

5. The tie-low circuit of claim 1 wherein the power supply voltage is 3.3 volts or even lower and an ESD voltage higher than 3.3 volts is applied to the power supply voltage during the ESD event.

6. The tie-low circuit of claim 1 wherein the PMOS transistor has a source coupled to the power supply voltage, a gate coupled to the first diode string, and a drain coupled to an output of the inverter.

7. The tie-low circuit of claim 1 wherein the NMOS transistor has a source coupled to the ground potential, a gate coupled to the first diode string, and a drain coupled to the output of the inverter.

8. A tie-low circuit capable of protecting a core circuit element during an electrostatic discharge (ESD) event, the tie-low circuit comprising:
at least one resistor having one terminal connected to the core circuit element and another terminal connected to a first potential for tying the core circuit element low to the first potential during a normal circuit operation; and
at least two diode strings coupled to each other, each diode string having at least two or more diodes serially coupled between the core circuit element and the first potential, in parallel with the resistor, for reducing a voltage difference across the core circuit element during an electrostatic discharge (ESD) event, thereby protecting the same from ESD damage, wherein the core circuit element comprises:
a first MOS device coupled to the first potential; and
a second MOS device serially connected to the first MOS device between the first potential and a second potential higher than the first potential to form an inverter.

9. The tie-low circuit of claim 8 wherein the first MOS device is a PMOS transistor and the second MOS device is an NMOS transistor.

10. The tie-low circuit of claim 9 wherein the at least two diode strings include a first diode string, and an anode of the first diode string is coupled to gates of the first and second MOS devices and a cathode of the first diode string is coupled to the first potential.

11. The tie-low circuit of claim 10 wherein the first diode string have two or more diodes serially coupled between the gates of the first and second MOS devices and the first potential, an anode of the first diode string being connected to the gates of the first and second MOS devices and a cathode of the first diode string being connected to the first potential for reducing the voltage difference across gate oxide layers of the first and second MOS devices, when a voltage level at the gates of the first and second MOS devices is higher than the first potential during an ESD event.

12. The tie-low circuit of claim 11 further comprising a second diode string serially coupled between the gates of the first and second MOS devices and the first potential, in parallel with the first diode string, a cathode of the second diode string being connected to the gates of the first and second MOS devices and an anode of the second diode string being connected to the first potential for reducing the voltage difference across the gate oxide layers of the first and second MOS devices, when a voltage level at the gates of the first and second MOS devices is lower than the first potential during an ESD event.

13. A tie-high circuit capable of protecting a core circuit element during an electrostatic discharge (ESD) event, the tie-high circuit comprising:
at least one resistor having one terminal connected to the core circuit element and another terminal connected to a first potential for tying the core circuit element high to the first potential during normal circuit operation; and
at least two diode strings coupled to each other in parallel, each diode sting having at least two or more diodes serially coupled between the core circuit element and the first potential, in parallel with the resistor, for reducing a voltage difference across the core circuit element during an electrostatic discharge (ESD) event, thereby protecting the same from ESD damage, wherein the core circuit element comprises:
a first MOS device coupled to a first potential; and
a second MOS device serially connected to the first MOS device between the first potential and a second potential lower than the first potential to form an inverter.

14. The tie-high circuit of claim 13 wherein the first MOS device is a PMOS transistor and the second MOS device is an NMOS transistor.

15. The tie-high circuit of claim 14 wherein the at least two diode strings include a first diode string, and a cathode of the first diode string is coupled to gates of the first and second MOS devices and an anode of the first diode string is coupled to the first potential.

16. The tie-high circuit of claim 15 wherein the first diode string is serially coupled between the gates of the first and second MOS devices and the first potential, a cathode of the first diode string being connected to the gates of the first and second MOS devices and an anode of the first diode string being connected to the first potential for reducing the voltage difference across gate oxide layers of the first and second MOS devices, when a voltage level at the gates of the first and second MOS devices is lower than the first potential during an ESD event.

17. The tie-high circuit of claim 16 further comprising a second diode string serially coupled between the gates of the first and second MOS devices and the first potential, in parallel with the first diode string, an anode of the second diode string being connected to the gates of the first and second MOS devices and a cathode of the second diode string being connected to the first potential for reducing the voltage difference across the gate oxide layers of the first and second MOS devices, when a voltage level at the gates of the first and second MOS devices is higher than the first potential during an ESD event.

* * * * *